(12) United States Patent
Zang et al.

(10) Patent No.: US 9,236,481 B1
(45) Date of Patent: Jan. 12, 2016

(54) SEMICONDUCTOR DEVICE AND METHODS OF FORMING FINS AND GATES WITH ULTRAVIOLET CURING

(71) Applicant: GLOBALFOUNDRIES Inc., Grand Cayman (KY)

(72) Inventors: Hui Zang, Guilderland, NY (US); Jin Ping Liu, Ballston Lake, NY (US)

(73) Assignee: GLOBALFOUNDRIES INC., Grand Cayman (KY)

(*) Notice: Subject to any disclaimer, the term of this patent is extended or adjusted under 35 U.S.C. 154(b) by 0 days.

(21) Appl. No.: 14/699,543

(22) Filed: Apr. 29, 2015

(51) Int. Cl.
| | |
|---|---|
| *H01L 27/088* | (2006.01) |
| *H01L 29/78* | (2006.01) |
| *H01L 29/49* | (2006.01) |
| *H01L 29/06* | (2006.01) |
| *H01L 29/66* | (2006.01) |
| *H01L 21/027* | (2006.01) |
| *H01L 21/311* | (2006.01) |
| *H01L 21/306* | (2006.01) |
| *H01L 21/308* | (2006.01) |
| *H01L 21/3213* | (2006.01) |

(52) U.S. Cl.
CPC ........ *H01L 29/7851* (2013.01); *H01L 21/0274* (2013.01); *H01L 21/3081* (2013.01); *H01L 21/3086* (2013.01); *H01L 21/30604* (2013.01); *H01L 21/31105* (2013.01); *H01L 21/32133* (2013.01); *H01L 29/0649* (2013.01); *H01L 29/4916* (2013.01); *H01L 29/6656* (2013.01); *H01L 29/66795* (2013.01)

(58) Field of Classification Search
CPC ............ H01L 21/0337; H01L 21/3086; H01L 21/308; H01L 21/027; H01L 21/0338; H01L 21/31144; H01L 21/762; H01L 21/76224; H01L 29/49; H01L 29/0653; H01L 29/16; H01L 29/66795
USPC .......................................... 257/401; 438/283
See application file for complete search history.

(56) References Cited

U.S. PATENT DOCUMENTS

| | | | |
|---|---|---|---|
| 2014/0273464 A1* | 9/2014 | Shieh ................ | H01L 29/66795 438/700 |
| 2015/0014772 A1* | 1/2015 | Cheng ................. | H01L 21/845 257/347 |
| 2015/0147886 A1* | 5/2015 | Tung ........................ | C23G 1/02 438/696 |

* cited by examiner

*Primary Examiner* — Trung Q Dang
(74) *Attorney, Agent, or Firm* — Heslin Rothenberg Farley & Mesiti P.C.

(57) ABSTRACT

Semiconductor devices and methods for forming devices with ultraviolet curing. One method includes, for instance: obtaining a wafer; forming at least one mandrel; forming spacers adjacent to the at least one mandrel; performing an ultraviolet treatment to at least one set of spacers; and etching to form hard mask regions below at least the spacers. An intermediate semiconductor device includes, for instance: a substrate; a stop layer over the substrate; a first barrier layer over the stop layer; at least one first mandrel and at least one second mandrel on the first barrier layer; at least one first set of spacers positioned adjacent to the first mandrel; at least one second set of spacers positioned adjacent to the second mandrel; and a second barrier layer over the at least one first mandrel and the at least one first set of spacers.

20 Claims, 11 Drawing Sheets

US 9,236,481 B1

SEMICONDUCTOR DEVICE AND METHODS OF FORMING FINS AND GATES WITH ULTRAVIOLET CURING

FIELD OF THE INVENTION

The present invention relates to semiconductor devices and methods of fabricating semiconductor devices, and more particularly to integrated circuits formed with ultraviolet curing and fabrication methods using ultraviolet curing.

BACKGROUND OF THE INVENTION

As semiconductor devices continue to decrease in size, the gate and fin formation processes continue to require formation of smaller gates and fins. With the currently available gate and fin formation processes it is challenging and in some cases impossible to achieve the necessary small gate and fin sizes. Thus, new gate and fin formation processes are needed.

SUMMARY OF THE INVENTION

The shortcomings of the prior art are overcome and additional advantages are provided through the provision, in one aspect, a method includes obtaining a wafer; forming at least one mandrel; forming spacers adjacent to the at least one mandrel; performing an ultraviolet treatment to at least one set of spacers; and etching to form hard mask regions below at least the spacers.

In another aspect, an intermediate semiconductor device is provided which includes, for instance: a substrate; a stop layer positioned over the substrate; a first barrier layer positioned over the stop layer; at least one first mandrel on the first barrier layer; at least one first set of spacers positioned adjacent to the at least one first mandrel; at least one second mandrel on the first barrier layer; at least one second set of spacers positioned adjacent to the at least one second mandrel; and a second barrier layer positioned over the at least one first mandrel and the at least one first set of spacers.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION OF THE INVENTION

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions and/or arrangements within the spirit and/or scope of the underlying inventive concepts will be apparent to those skilled in the art from this disclosure. Note also that reference is made below to the drawings, which are not drawn to scale for ease of understanding, wherein the same reference numbers used throughout different figures designate the same or similar components.

Generally stated, disclosed herein are certain semiconductor devices, for example, field-effect transistors (FETs), which provide advantages over the above noted, existing semiconductor devices and fabrication processes. Advantageously, the semiconductor device fabrication processes disclosed herein provide for devices with smaller fins and gates, as well as the formation of multiple size fins and gates using one formation process. Although only shown with respect to FinFET devices, it is also contemplated that the below described processes may be performed during planar device fabrication.

Figure 1:
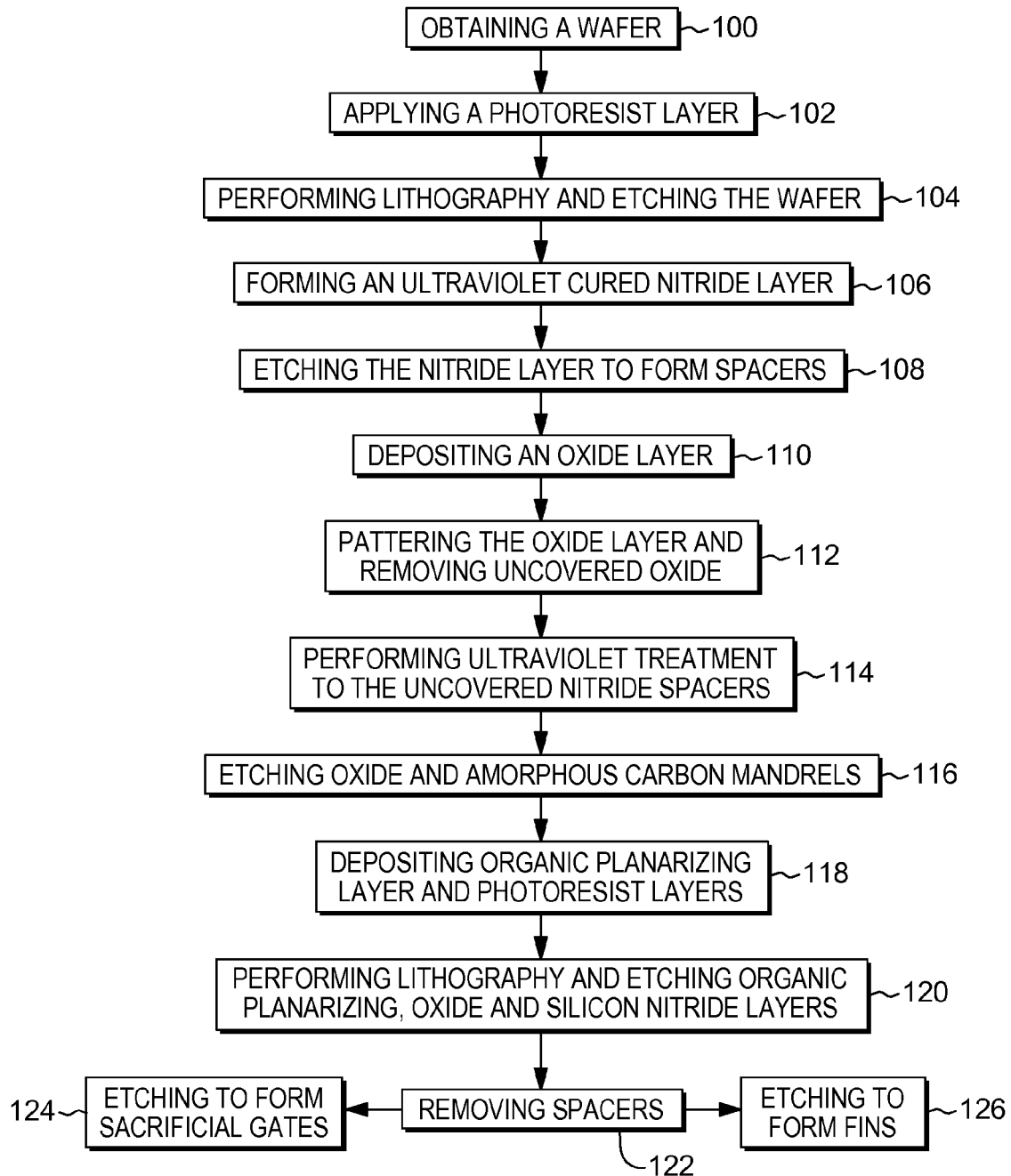
FIG. 1 depicts one embodiment of a method for forming a semiconductor device with an ultraviolet curing sidewall image transfer process, in accordance with one or more aspects of the present invention.

In one aspect, in one embodiment, as shown in FIG. 1, a semiconductor device formation process in accordance with one or more aspects of the present invention may include, for instance: obtaining a wafer after polysilicon deposition, planarization, and hard mask deposition 100; applying a photoresist layer over the wafer 102; performing lithography and etching the wafer to form mandrels 104; forming an ultraviolet cured nitride layer 106; etching the nitride layer to form spacers 108; depositing a second barrier layer over the wafer 110; patterning the second barrier layer and removing the uncovered second barrier layer 112; performing an ultraviolet treatment to the uncovered spacers 114; etching the second barrier layer and mandrels 116; depositing an organic planarizing layer and a photoresist layer 118; performing lithography and etching the organic planarizing layer, first barrier layer, and stop layer 120; removing the spacers 122; and etching to form sacrificial gates or poly gates 124 or etching to form fins 126.

FIGS. 2-21 depict, by way of example only, several detailed embodiments of a portion of the FinFET device formation process of FIG. 1 and a portion of an intermediate FinFET structure, in accordance with one or more aspects of the present invention. Note again that these figures are not drawn to scale in order to facilitate understanding of the invention, and that the same reference numerals used throughout different figures designate the same or similar elements.

Figure 2:
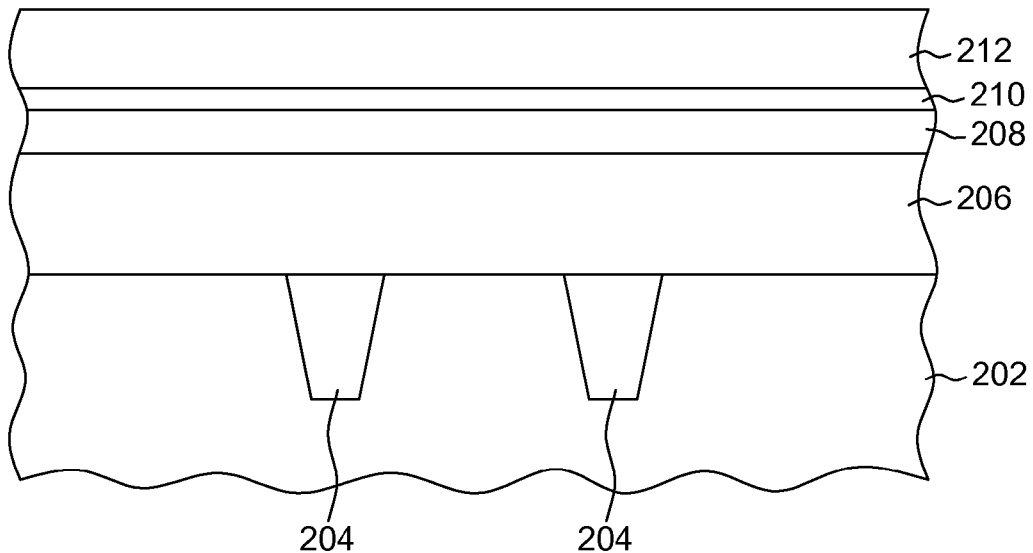
FIG. 2 depicts a cross-sectional view of one embodiment of a portion of an intermediate semiconductor device, in accordance with one or more aspects of the present invention.

One detailed embodiment of a portion of the FinFET device formation process of FIG. 1 is depicted, by way of example only, in FIGS. 2-11. FIG. 2 shows a portion of a semiconductor device 200 obtained during the fabrication process. The device 200 may have been processed through initial device processing steps in accordance with the design of the device 200 being fabricated, for example, the device 200 may include, for example, a substrate 202 and at least one isolation region 204 positioned within the substrate 202. The substrate 202 may be, for example, silicon or any other known substrate material. The isolation regions 204 may be, for example, an oxide material. Although not shown, it is also contemplated that additional features may be present or later formed on the device 200, for example, at least one source region and at least one drain region.

As shown in FIG. 2, the device 200 may also include a polysilicon layer 206 deposited over the substrate 202 and isolation regions 204. In addition, a stop layer 208 may be deposited over the polysilicon layer 206. The stop layer 208 may be, for example, a silicon nitride layer. A first barrier layer 210 may be deposited over the stop layer 208 and the first barrier layer 210 may be, for example, oxide layer. Then, a mandrel material layer 212 may be deposited over the first barrier layer 210 to protect the underlying devices during etching processes. The mandrel material layer 212 may be, for example, an amorphous carbon layer.

Figure 3:
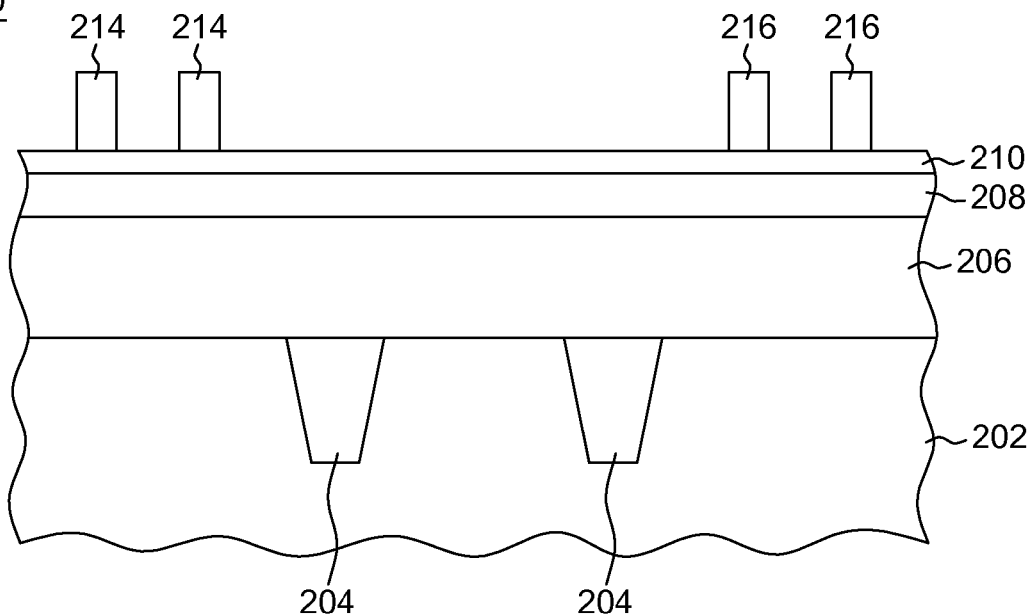
FIG. 3 depicts the structure of FIG. 2 after performing lithography and etching to form the mandrels, in accordance with one or more aspects of the present invention.
Figure 4:
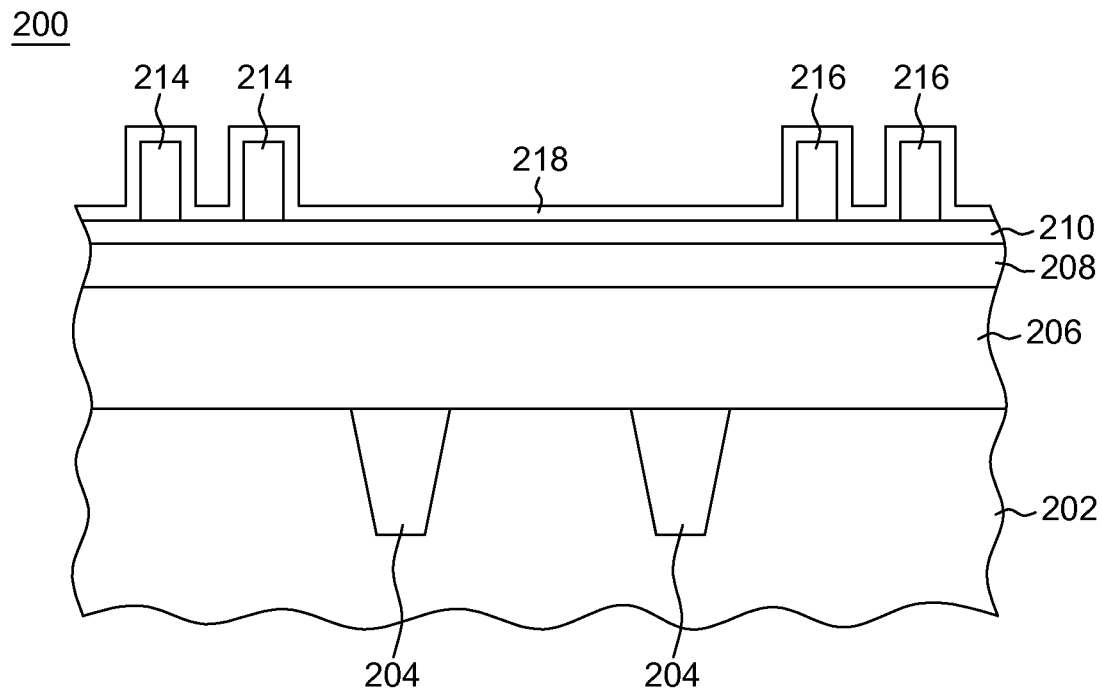
FIG. 4 depicts the structure of FIG. 3 after depositing an ultraviolet cured nitride layer, in accordance with one or more aspects of the present invention.
Figure 5:
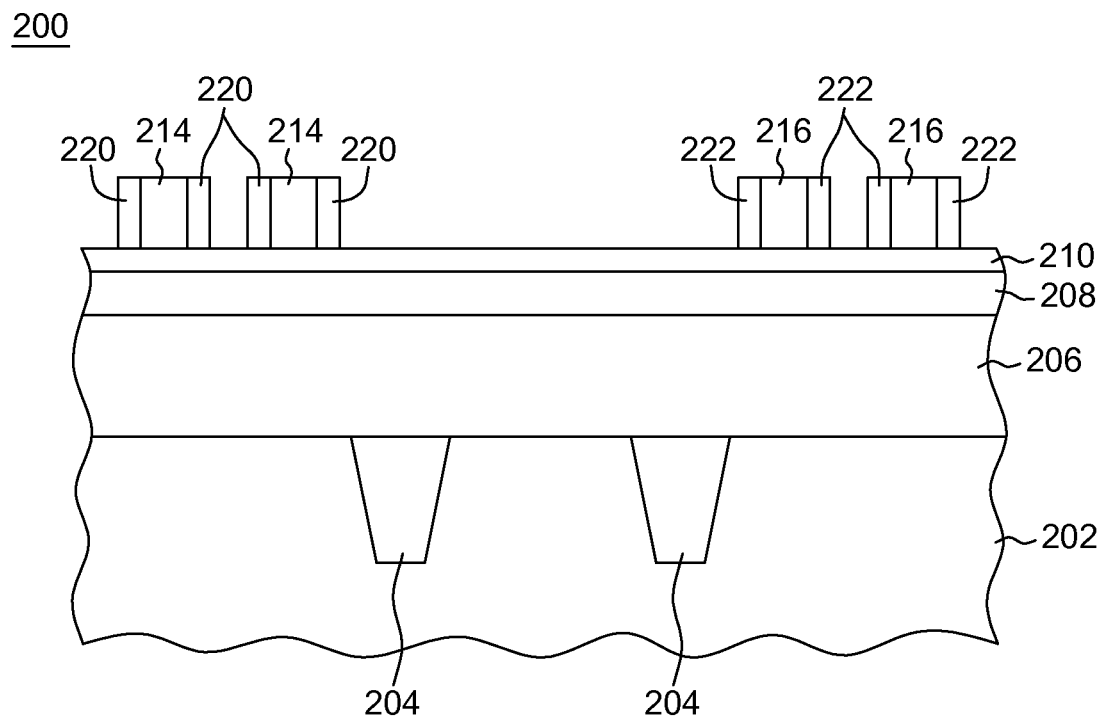
FIG. 5 depicts the structure of FIG. 4 after etching the nitride layer to form spacers, in accordance with one or more aspects of the present invention.

Next, as shown in FIG. 3, lithography and etching may be performed on the device 200 to remove a portion of the mandrel material layer 212 not covered by the patterned photoresist layer (not shown) to form one or more mandrels 214, 216. After the mandrels 214, 216 are formed, a spacer material layer 218 may be applied over the device 200, as shown in FIG. 4. The spacer material layer 218 may be applied by, for example, conformal deposition and the spacer material layer 218 may be, for example, an ultraviolet cured nitride layer. As depicted in FIG. 5, the spacer material layer 218 may be etched by, for example, a vertical etch to form spacers 220, 222. The first set of spacers 220 may be positioned adjacent to the first mandrels 214 and the second set of spacers 222 may be positioned adjacent to the second mandrels 216.

Figure 6:
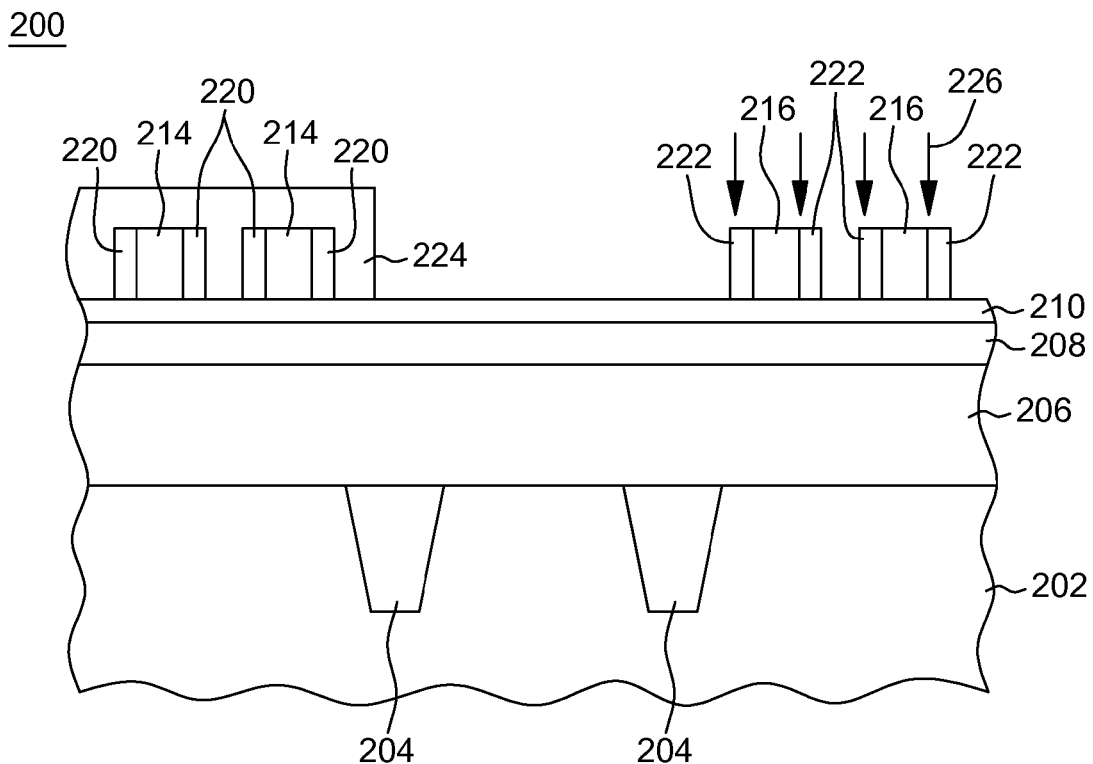
FIG. 6 depicts the structure of FIG. 5 after depositing and patterning an oxide layer and while performing a ultraviolet treatment to the device, in accordance with one or more aspects of the present invention.
Figure 7:
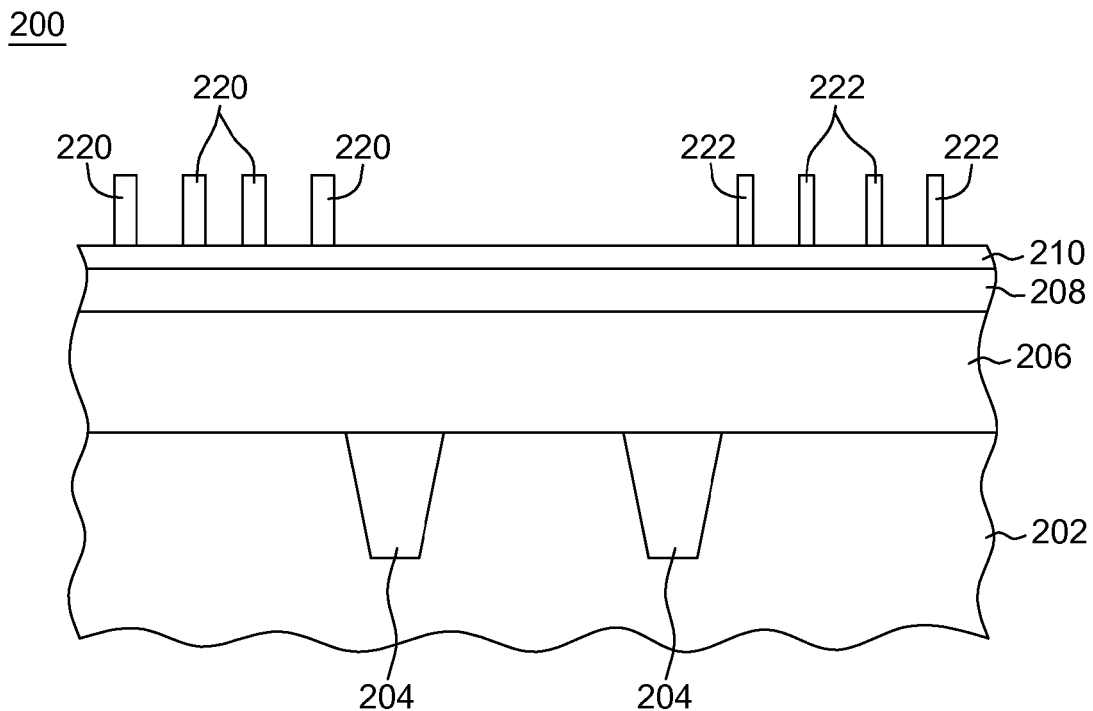
FIG. 7 depicts the structure of FIG. 6 after the ultraviolet treatment and etching to remove the oxide layer and the mandrels, in accordance with one or more aspects of the present invention.

After the spacers 220, 222 are formed, a second barrier layer may be deposited over the device 200 and planarized by, for example, chemical mechanical planarization (CMP). Lithography may then be performed to pattern and etch the second barrier layer to remove the portion of the second barrier layer that is not covered by the pattern. After etching, the portion of the second barrier layer 224, which was covered by the pattern, will remain. The second barrier layer may be, for example, an oxide layer or any ultraviolet blocking material. As shown in FIG. 6, the second barrier portion 224 may be, for example, positioned over the first set of mandrels 214 and spacers 220, while the second set of mandrels 216 and spacers 222 are exposed. Next, an ultraviolet treatment 226 may be performed to reduce the size of the spacers 222. The size of the spacers 220 will not be reduced by the ultraviolet treatment 226 because the second barrier portion 224 reflects or absorbs the ultraviolet treatment 226 and prevents the spacers 220 from reducing in size. As shown in FIG. 7, after the ultraviolet treatment 226, the device 200 may be etched to remove the second barrier portion 224 and to remove the mandrels 214, 216.

Figure 8:
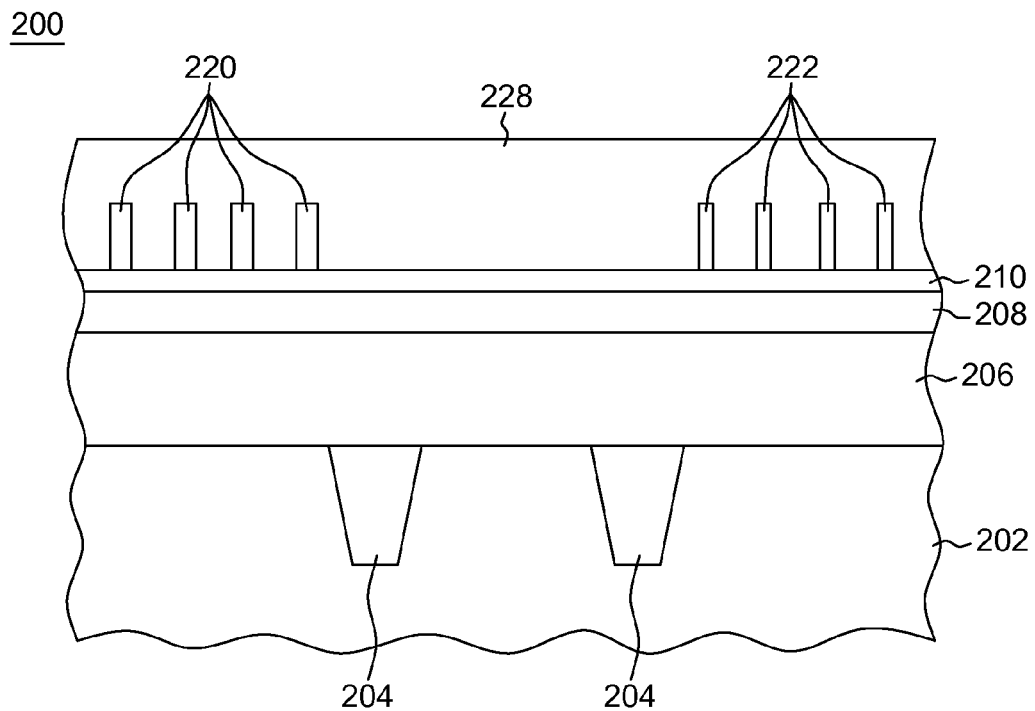
FIG. 8 depicts the structure of FIG. 7 after depositing an organic planarizing layer, in accordance with one or more aspects of the present invention.
Figure 9:
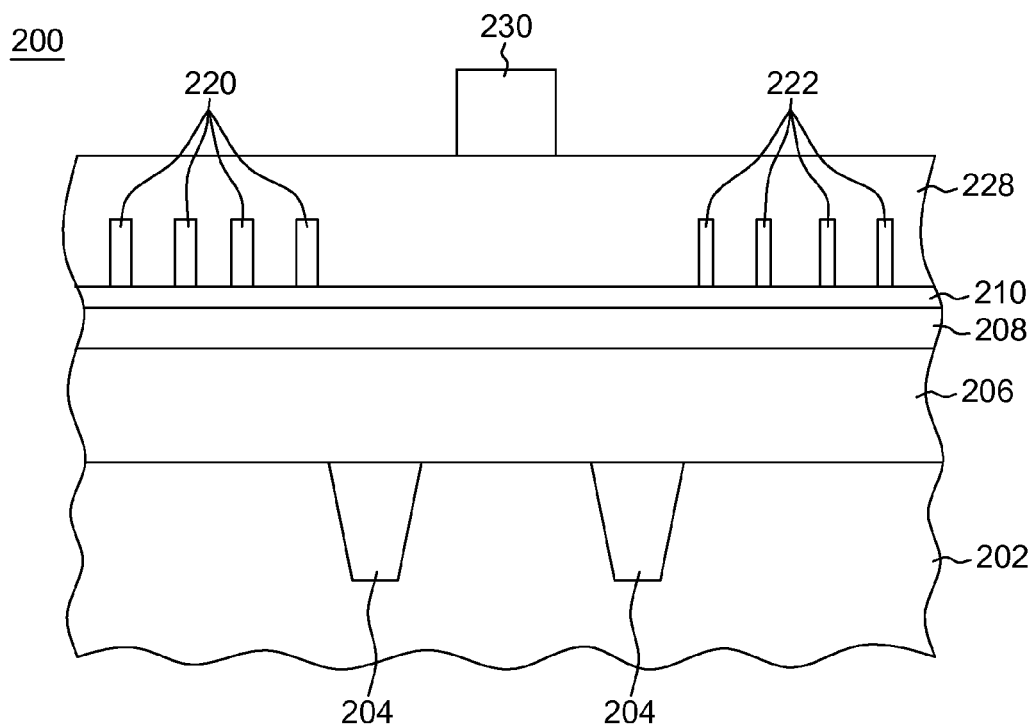
FIG. 9 depicts the structure of FIG. 8 after depositing and patterning a photoresist layer, in accordance with one or more aspects of the present invention.
Figure 10:
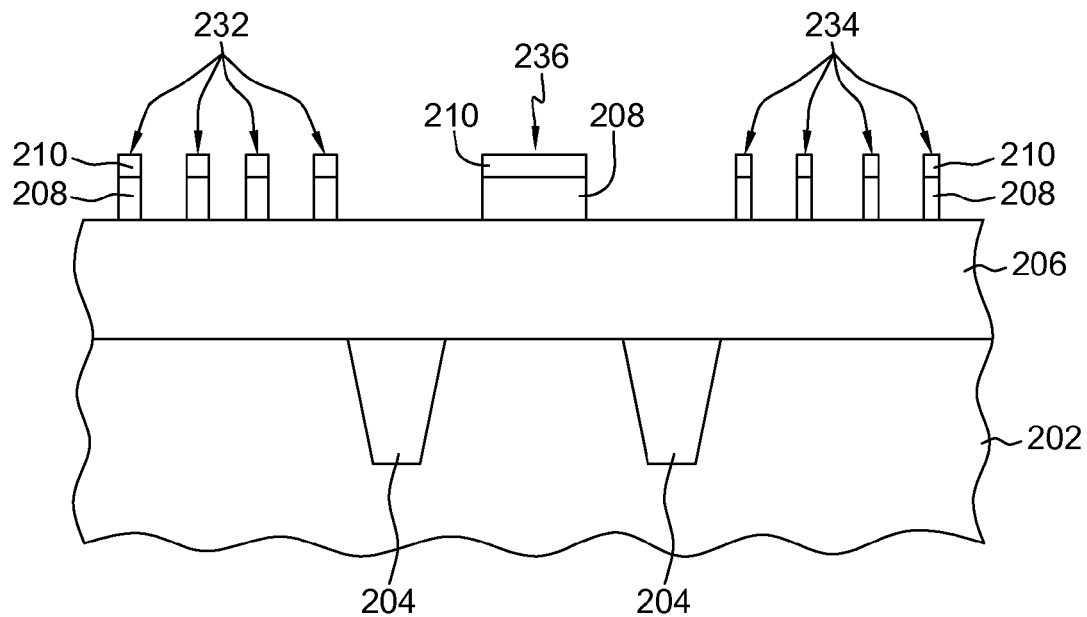
FIG. 10 depicts the structure of FIG. 9 after etching the organic planarizing layer, oxide layer, and silicon nitride layer and removing the spacers, in accordance with one or more aspects of the present invention.
Figure 11:
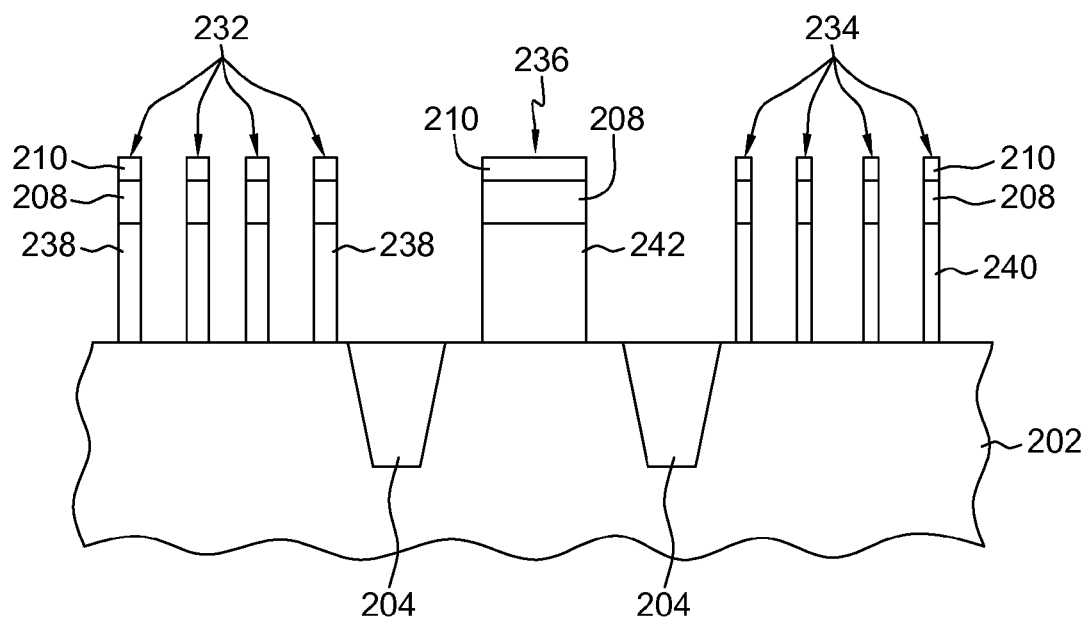
FIG. 11 depicts the structure of FIG. 10 after etching the polysilicon layer to form sacrificial gates, in accordance with one or more aspects of the present invention.

Next, an organic planarization layer (OPL) 228 may be deposited over the device 200, as shown in FIG. 8. A photoresist layer 230 may then be deposited and patterned as shown in FIG. 9. Etching may be performed over the device 200 to remove the uncovered portion of the OPL 228. Further etching may be performed to remove the portions of the barrier layer 210 and stop layer 208 not covered by the spacers 220, 222 or the remaining portion of the OPL 228. The remaining OPL 228 and spacers 220, 222 may then be removed as shown in FIG. 10. The portions of the barrier layer 210 and stop layer 208 remaining after the etching and removal of the spacers 220, 222 and OPL 228 form hard mask regions 232, 234, 236. The hard mask regions 232, 234, 236 may be, for example, masks for forming sacrificial gates, as described in greater detail below. The first hard mask regions 232 may be, for example, the same size or larger than the second hard mask regions 234. In one embodiment, the first hard mask regions 232 may be, for example, approximately 15 nm to 30 nm and the second hard mask regions 234 may be, for example, approximately 5 nm to 20 nm. As shown in FIG. 11, the polysilicon layer 206 may then be etched to remove the polysilicon material not covered by the hard mask regions 232, 234, 236 to form sacrificial gates 238, 240, 242. After formation of the sacrificial gates 238, 240, 242, additional device fabrication processes may be performed including, for example, spacer and epi source and drain formation processes.

Figure 12:
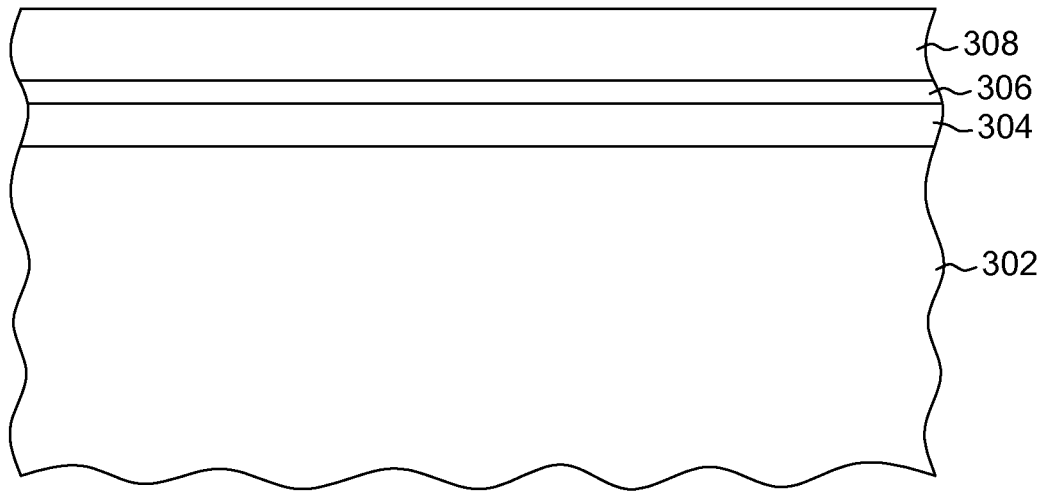
FIG. 12 depicts a cross-sectional view of another embodiment of a portion of an intermediate semiconductor device, in accordance with one or more aspects of the present invention.

Referring now to FIGS. 12-21, another detailed embodiment of a portion of a FinFET device formation process of FIG. 1 is depicted. FIG. 12 shows a portion of a semiconductor device 300 obtained during the fabrication process. The device 300 may have been processed through initial device processing steps in accordance with the design of the device 300 being fabricated. The device 300 may include, for example, a substrate 302, a stop layer 304 deposited over the substrate 302, a barrier layer 306 deposited over the stop layer 304, and a mandrel material layer 308 deposited over the barrier layer 306. The substrate 302 may be, for example, silicon or any other known substrate material. The stop layer 304 may be, for example, a silicon nitride layer. The barrier layer 306 may be, for example, an oxide layer. The mandrel material layer 308 may be, for example, an amorphous carbon layer. Although not shown, it is also contemplated that additional features may be present on the device 300, for example, isolation regions, source regions, and drain regions.

Figure 13:
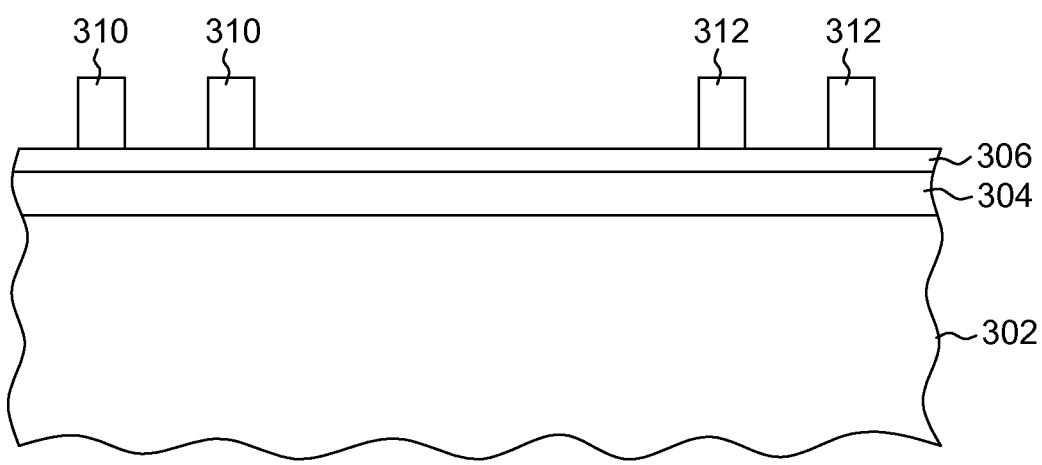
FIG. 13 depicts the structure of FIG. 12 after performing lithography to form the mandrels, in accordance with one or more aspects of the present invention.
Figure 14:
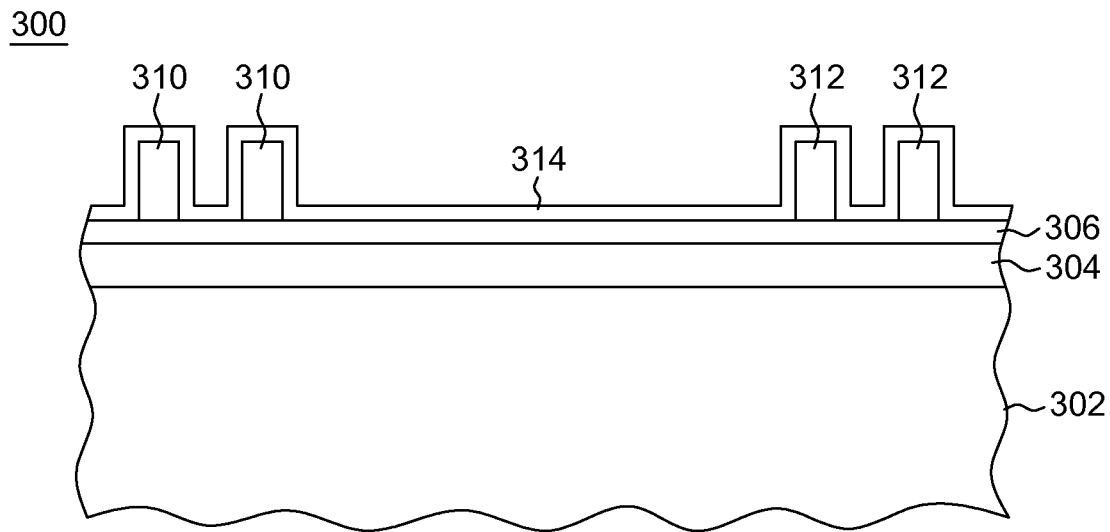
FIG. 14 depicts the structure of FIG. 13 after depositing an ultraviolet cured nitride layer, in accordance with one or more aspects of the present invention.
Figure 15:
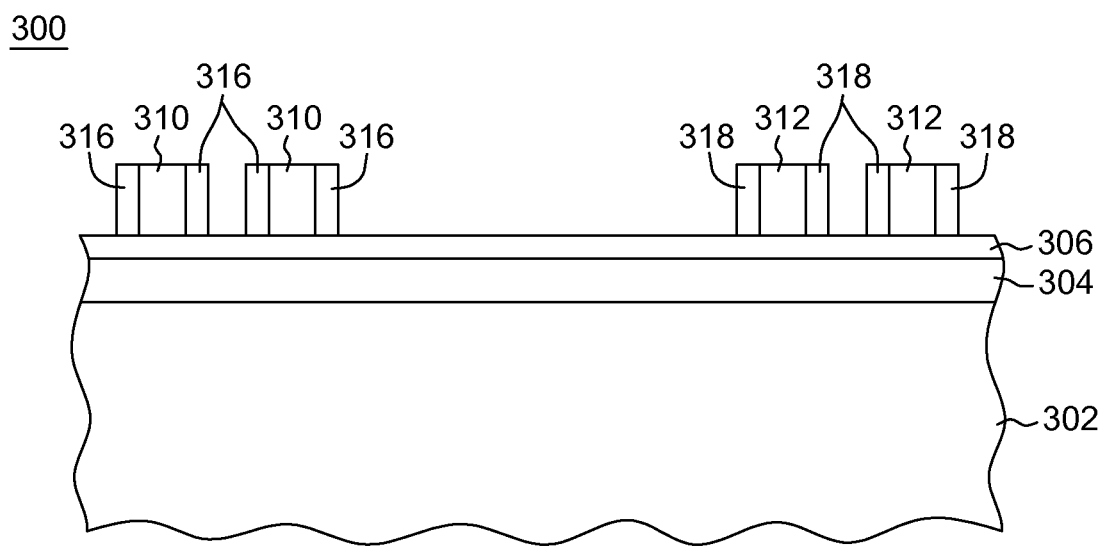
FIG. 15 depicts the structure of FIG. 14 after etching to form spacers, in accordance with one or more aspects of the present invention.

Next, as shown in FIG. 13, lithography and etching may be performed on the device 300 to remove the portion of the mandrel material layer 308 not covered by the patterned photoresist layer (not shown) to form one or more mandrels 310, 312. After the mandrels 310, 312 are formed, a spacer material layer 314 may be applied over the device 300, as shown in FIG. 14. The spacer material layer 314 may be, for example, conformally deposited over the device 300 and may be an ultraviolet cured nitride layer. As depicted in FIG. 15, the spacer material layer 314 may be etched by, for example, a vertical etch to form spacers 316, 318. The spacers 316 may be positioned adjacent to the mandrels 310 and the spacers 318 may be positioned adjacent to the mandrels 312.

Figure 16:
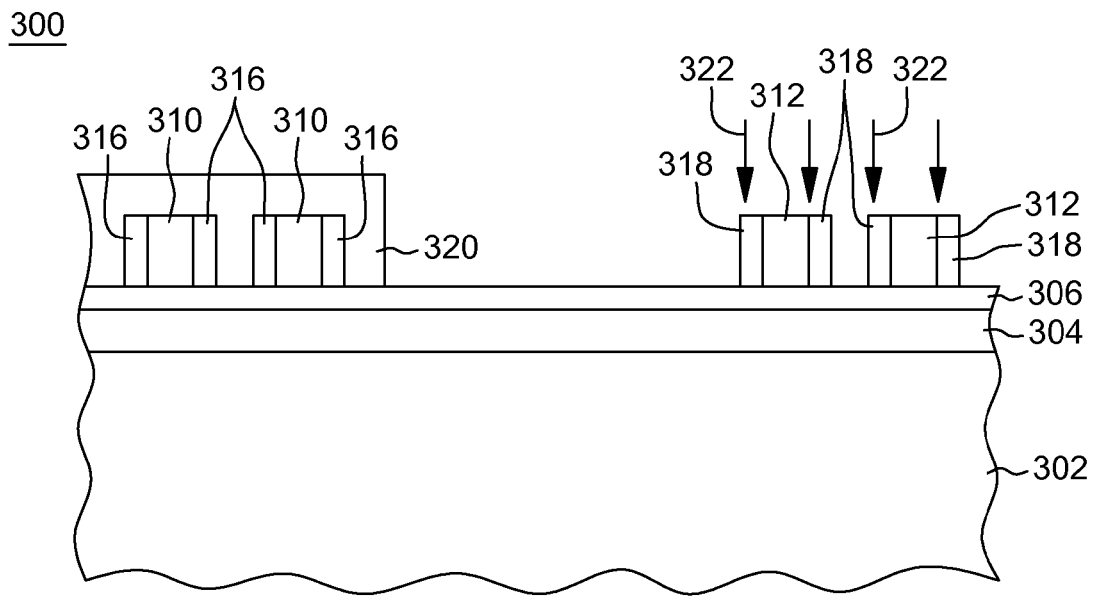
FIG. 16 depicts the structure of FIG. 15 after depositing and patterning a second barrier layer and performing an ultraviolet treatment to the device, in accordance with one or more aspects of the present invention.
Figure 17:
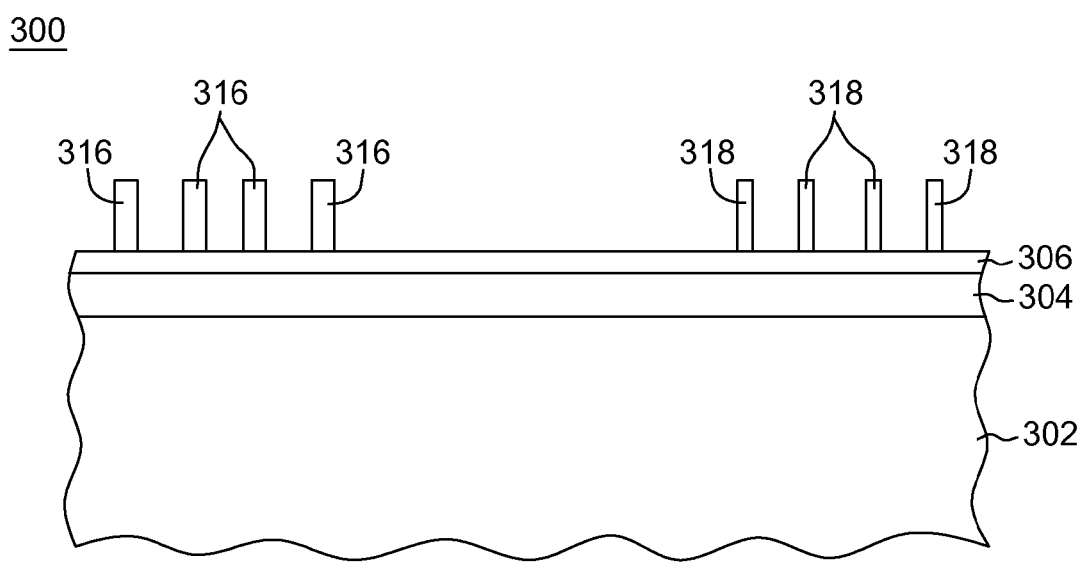
FIG. 17 depicts the structure of FIG. 16 after etching to remove the second barrier layer and the mandrels, in accordance with one or more aspects of the present invention.

After the spacers 316, 318 are formed, a second barrier layer may be deposited over the device 300 and planarized by, for example, CMP. The second barrier layer may then be patterned and etched to remove the portion of the second barrier layer that is not covered by the pattern. After etching a portion of the second barrier layer 320, which was covered by the pattern, will remain. The second barrier layer may be, for example, an oxide layer or any ultraviolet blocking material. As shown in FIG. 16, the second barrier portion 320 may be, for example, positioned over the first set of mandrels 310 and spacers 316, while the second set of mandrels 312 and spacers 318 are exposed. Next, an ultraviolet treatment 322 may be performed to reduce the size of the spacers 318. The size of the spacers 318 will not be reduced by the ultraviolet treatment 322 because the second barrier portion 320 reflects or absorbs the ultraviolet treatment 322 and prevents the spacers 316 from reducing in size. As shown in FIG. 17, after the ultraviolet treatment 322, the device 300 may be etched to remove the second barrier portion 320 and to remove the mandrels 310, 312.

Figure 18:
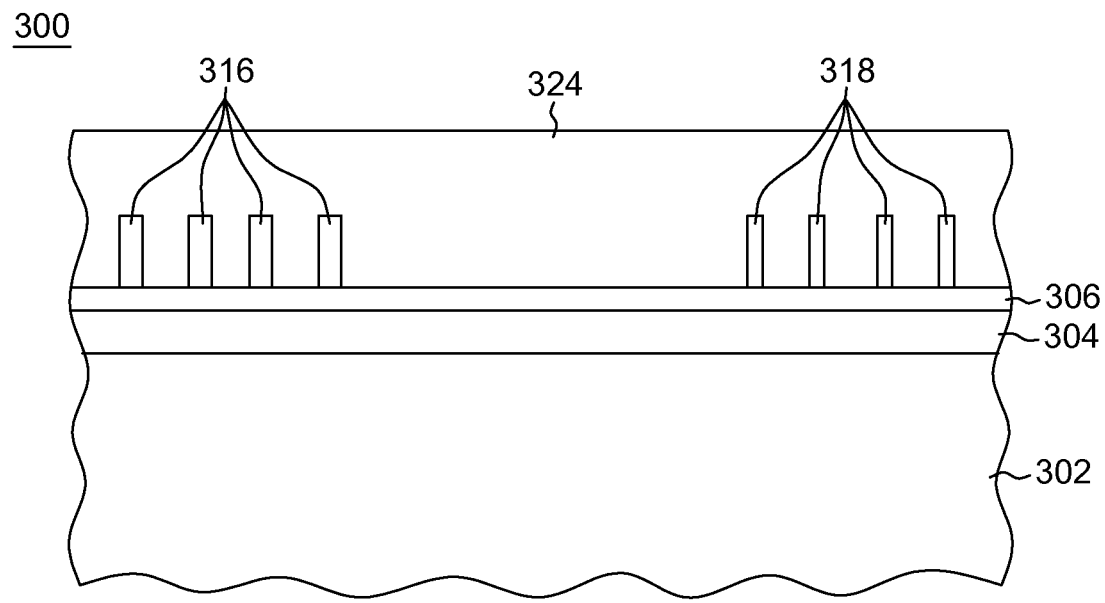
FIG. 18 depicts the structure of FIG. 17 after depositing an organic planarizing layer, in accordance with one or more aspects of the present invention.
Figure 19:
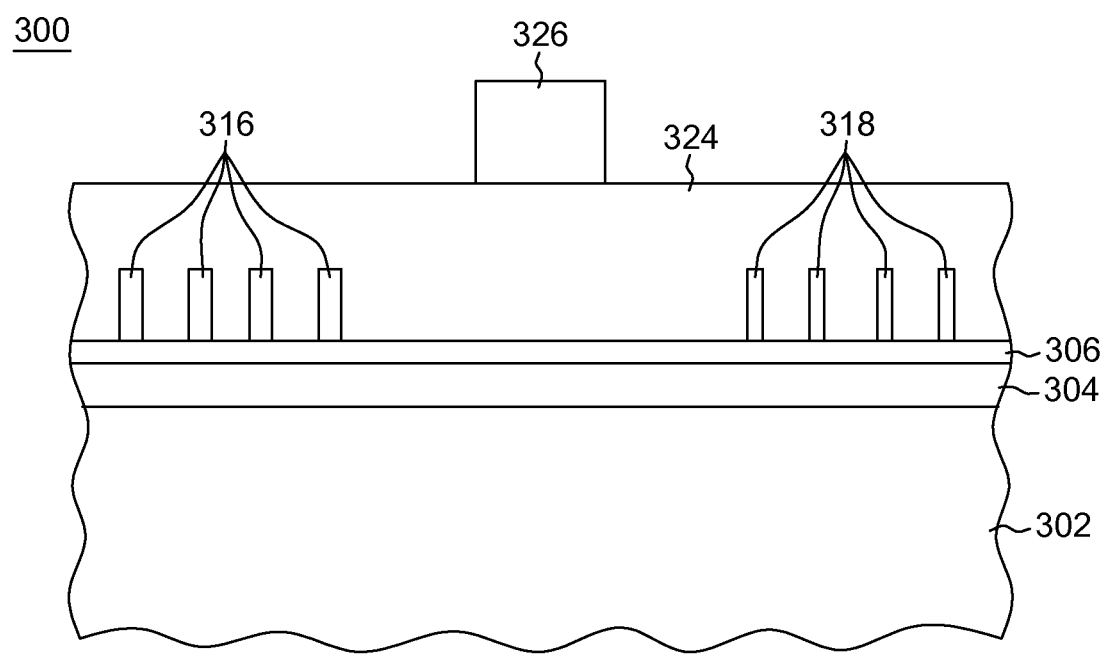
FIG. 19 depicts the structure of FIG. 18 after depositing and patterning a photoresist layer, in accordance with one or more aspects of the present invention.
Figure 20:
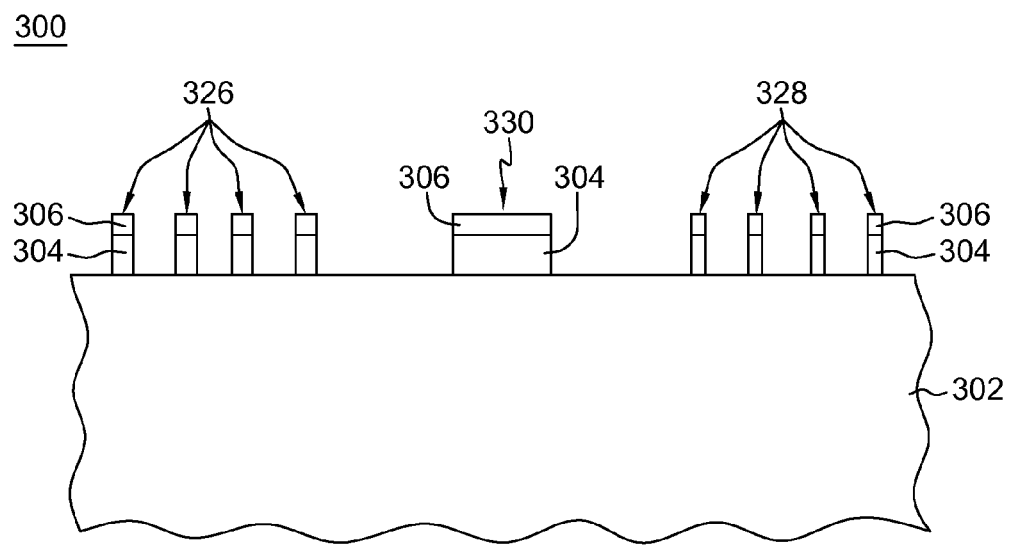
FIG. 20 depicts the structure of FIG. 19 after etching the organic planarizing layer, the first barrier layer, and the stop layer and removing the spacers, in accordance with one or more aspects of the present invention.
Figure 21:
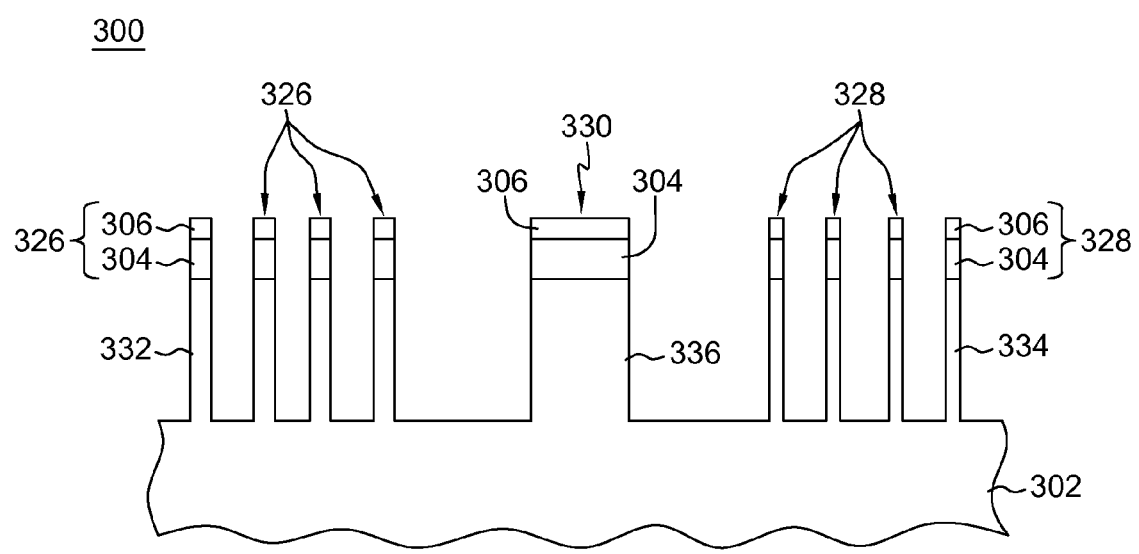
FIG. 21 depicts the structure of FIG. 20 after etching a portion of the substrate to form at least one fin, in accordance with one or more aspects of the present invention.

Next, an organic planarization layer (OPL) 324 may be deposited over the device 300, as shown in FIG. 18. A photoresist layer 326 may then be deposited and patterned as shown in FIG. 19. Etching may then be performed over the device 300 to remove the uncovered portion of the OPL 324. Further etching may be performed to remove the portions of the barrier layer 306 and stop layer 304 not covered by the spacers 316, 318 or photoresist layer 326. Then, the spacers 316, 318 may be removed as shown in FIG. 20. The portions of the barrier layer 306 and stop layer 304 remaining after the etching and removal of the spacers 316, 318 and photoresist layer 326 form the hard mask regions 326, 328, 330. The hard mask regions 326, 328, 330 may be, for example, masks for forming fins, as described in greater detail below. The first hard mask regions 326 may be, for example, the same size or larger than the second hard mask regions 328. In one embodiment, the first hard mask regions 326 may be, for example, approximately 15 nm to 30 nm and the second hard mask regions 328 may be, for example, approximately 5 nm to 20 nm. As shown in FIG. 21, the substrate 302 may then be etched to remove the silicon material not covered by the hard mask regions 326, 328, 330 to form fins 332, 334, 336. After formation of the fins 332, 334, 336, additional device fabrication processes may be performed including, for example, gate formation and/or back end of line processing.

As may be recognized by those of ordinary skill in the art based on the teachings herein, numerous changes and modifications may be made to the above-described and other embodiments of the present invention without departing from the scope of the invention. For example, other components of the device and/or method as disclosed in the specification, including the accompanying abstract and drawings, may be replaced by alternative component(s) or features(s), such as those disclosed in another embodiment, which serve the same, equivalent or similar purpose as known by those skilled in the art to achieve the same, equivalent or similar results by such alternative component(s) or feature(s) to provide a similar function for the intended purpose. In addition, the devices and systems may include more or fewer components or features than the embodiments as described and illustrated herein. For example, the components and features of FIGS. 2-11 and FIGS. 12-21 may all be used interchangeably and in alternative combinations as would be modified or altered by one of skill in the art. Accordingly, this detailed description of the currently-preferred embodiments is to be taken as illustrative, as opposed to limiting of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
   obtaining a wafer;
   forming at least one mandrel;
   forming spacers adjacent to the at least one mandrel;
   performing an ultraviolet treatment to at least one set of spacers; and
   etching to form hard mask regions below at least the spacers.

2. The method of claim 1, wherein the wafer comprises:
   a substrate;
   a stop layer deposited over the substrate;
   a first barrier layer deposited over the stop layer; and
   a mandrel material layer deposited over the first barrier layer.

3. The method of claim 2, wherein the wafer further comprises:
   a polysilicon layer deposited over the substrate before the deposition of the stop layer.

4. The method of claim 2, wherein forming at least one mandrel comprises:
   depositing a photoresist layer over the mandrel material layer;
   performing lithography to the photoresist layer; and
   etching the mandrel material layer to form the at least one mandrel.

5. The method of claim 1, wherein forming spacers adjacent to the at least one mandrel comprises:
   depositing a spacer material layer over the wafer; and
   etching the spacer material layer to form the at least one set of spacers.

6. The method of claim 5, wherein the spacer material layer is an ultraviolet cured nitride layer conformally deposited over the wafer and vertically etched to form the at least one set of spacers.

7. The method of claim 2, wherein the spacers comprise:
   at least one first set of spacers adjacent to at least one first mandrel; and
   at least one second set of spacers adjacent to at least one second mandrel.

8. The method of claim 7, further comprising:
   depositing a second barrier layer over the wafer after the spacers are formed; and
   performing lithography to the second barrier layer leaving at least one second barrier portion covering the at least one first set of spacers and exposing the at least one second set of spacers.

9. The method of claim 8, wherein the ultraviolet treatment is performed on the at least one second set of spacers.

10. The method of claim 8, further comprising:
    etching to remove the at least one second barrier portion; and
    etching to remove the at least one first mandrel and the at least one second mandrel.

11. The method of claim 10, wherein etching to form hard mask regions below at least the spacers further comprises:
    depositing an organic planarization layer over the wafer after etching to remove the at least one first and second mandrels;
    performing lithography to pattern the organic planarization layer;
    etching the wafer to form hard mask regions below the at least one first set of spacers, the at least one second set of spacers, and the remaining organic planarization layer.

12. The method of claim 11, wherein the hard mask regions comprise:
    a portion of the first barrier layer and a portion of the stop layer.

13. The method of claim 2, further comprising:
    etching the substrate to form fins below the hard mask regions.

14. The method of claim 3, further comprising:
    etching the polysilicon layer to form sacrificial gates below the hard mask regions.

15. An intermediate semiconductor device comprising:
    a substrate;
    a stop layer positioned over the substrate;
    a first barrier layer positioned over the stop layer;
    at least one first mandrel on the first barrier layer;
    at least one first set of spacers positioned adjacent to the at least one first mandrel;
    at least one second mandrel on the first barrier layer;
    at least one second set of spacers positioned adjacent to the at least one second mandrel; and
    a second barrier layer positioned over the at least one first mandrel and the at least one first set of spacers.

16. The device of claim 15, wherein the at least first set of spacers has a first width and the at least one second set of spacers has a second width.

17. The device of claim 16, wherein the first width is larger than the second width.

18. The device of claim 16, wherein the first width ranges from 15 nm to 30 nm and the second width ranges from 5 nm to 20 nm.

19. The device of claim 15, wherein the device further comprises:
    a polysilicon layer positioned between the substrate and the stop layer.

20. The device of claim 15, wherein the device further comprises:
    at least one isolation region positioned within the substrate.

* * * * *